(12) United States Patent
Dijken et al.

(10) Patent No.: US 10,050,185 B2
(45) Date of Patent: Aug. 14, 2018

(54) HERMETICALLY SEALED ILLUMINATION DEVICE WITH LUMINESCENT MATERIAL AND MANUFACTURING METHOD THEREFOR

(71) Applicant: KONINKLIJKE PHILIPS N.V., Eindhoven (NL)

(72) Inventors: Durandus Kornelius Dijken, Eindhoven (NL); Manuela Lunz, Eindhoven (NL); Hendrik Johannes Boudewijn Jagt, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 14/764,216

(22) PCT Filed: Mar. 26, 2014

(86) PCT No.: PCT/EP2014/056007
§ 371 (c)(1),
(2) Date: Jul. 29, 2015

(87) PCT Pub. No.: WO2014/154722
PCT Pub. Date: Oct. 2, 2014

(65) Prior Publication Data
US 2016/0013374 A1 Jan. 14, 2016

Related U.S. Application Data (60) Provisional application No. 61/805,207, filed on Mar. 26, 2013.

(30) Foreign Application Priority Data

Mar. 26, 2013 (EP) ..................................... 13161033

(51) Int. Cl.
*H01L 33/50* (2010.01)
*H01L 33/48* (2010.01)
(Continued)

(52) U.S. Cl.
CPC .............. *H01L 33/507* (2013.01); *F21K 9/64* (2016.08); *F21K 9/90* (2013.01); *H01L 33/005* (2013.01);
(Continued)

(58) Field of Classification Search
CPC ... H01L 33/507; H01L 33/005; H01L 33/483; H01L 33/486; H01L 25/0753;
(Continued)

(56) References Cited

U.S. PATENT DOCUMENTS 7,819,549 B2  10/2010 Narendran et al.
8,028,537 B2  10/2011 Hanley et al.
(Continued)

FOREIGN PATENT DOCUMENTS

JP  1997283082 A  10/1997
JP  2002185046 A  6/2002
(Continued)

OTHER PUBLICATIONS

First Office Action dated Jan. 29, 2018, Chinese Patent Application No. 201480018341, 18 pages.
(Continued)

*Primary Examiner* — Fernando L Toledo
*Assistant Examiner* — Neil Prasad (57) ABSTRACT

An illumination device is manufactured by providing (101) a substrate (1) having a first side (1a), sealingly coupling (106) an at least partially light transmitting cover (2) to the substrate (1) such that an enclosed space (3) is defined by at least the first side (1a) of the substrate (1) and the cover (2), providing a through-hole (4) into the enclosed space (3), and introducing (107) a luminescent material into the enclosed space (3) via the through-hole (4). By hermetically sealing (108) the through-hole (4) after the introduction of the luminescent material, the enclosed space (3) becomes sealed
(Continued)

and hence luminescent materials being relatively sensitive to e.g. water and/or oxygen become protected from exposure to the environment.

24 Claims, 4 Drawing Sheets

(51) Int. Cl.
    *F21K 9/90*     (2016.01)
    *H01L 33/00*     (2010.01)
    *F21K 9/64*     (2016.01)
    *H01L 25/075*     (2006.01)
    *H01L 33/64*     (2010.01)

(52) U.S. Cl.
    CPC .......... H01L 33/483 (2013.01); H01L 33/486 (2013.01); *H01L 25/0753* (2013.01); *H01L 33/508* (2013.01); *H01L 33/644* (2013.01); *H01L 2924/0002* (2013.01); *H01L 2933/0041* (2013.01)

(58) Field of Classification Search
    CPC ................. H01L 33/508; H01L 33/644; H01L 2924/0002; H01L 2933/0041; F21K 9/56; F21K 9/90
    See application file for complete search history.

(56) References Cited

U.S. PATENT DOCUMENTS

| | | |
|---|---|---|
| 8,164,825 B2 | 4/2012 | Narendran et al. |
| 8,334,644 B2 | 12/2012 | Ramer |
| 2002/0079837 A1 | 6/2002 | Okazaki |
| 2004/0144987 A1 | 7/2004 | Ouderkirk et al. |
| 2009/0275257 A1 | 11/2009 | Sun et al. |
| 2009/0296368 A1 | 12/2009 | Ramer |
| 2010/0055813 A1 | 3/2010 | Sun et al. |
| 2010/0155749 A1 | 6/2010 | Chen et al. |
| 2010/0177496 A1 | 7/2010 | Gillies et al. |
| 2010/0328925 A1 | 12/2010 | Hoelen et al. |
| 2011/0025190 A1 | 2/2011 | Jagt |
| 2011/0176289 A1 | 7/2011 | Ramer et al. |
| 2011/0182056 A1 | 7/2011 | Trottier et al. |
| 2011/0215348 A1 | 9/2011 | Trottier et al. |
| 2011/0248287 A1* | 10/2011 | Yuan ...................... H01L 33/60 257/88 |
| 2011/0291135 A1* | 12/2011 | Hsieh .................... H01L 33/641 257/98 |
| 2011/0317397 A1 | 12/2011 | Trottier |
| 2012/0012865 A1 | 1/2012 | Li et al. |
| 2012/0018757 A1* | 1/2012 | Jeong .................... H01L 33/405 257/98 |
| 2012/0075837 A1 | 3/2012 | Um |
| 2012/0098005 A1* | 4/2012 | Chan ..................... H01L 33/507 257/98 |
| 2012/0113672 A1 | 5/2012 | Dobrow et al. |
| 2012/0140435 A1 | 6/2012 | Li et al. |
| 2012/0205712 A1* | 8/2012 | Hayashi .............. B29C 45/0046 257/100 |
| 2012/0241800 A1 | 9/2012 | Rains, Jr. et al. |

FOREIGN PATENT DOCUMENTS

| | | |
|---|---|---|
| JP | 2011510445 A | 3/2011 |
| JP | 2012064345 A | 3/2012 |
| JP | 2012104788 A | 5/2012 |
| KR | 20120048772 A | 5/2012 |
| WO | 2009066670 A1 | 5/2009 |
| WO | 2009115998 A2 | 9/2009 |
| WO | 2012120434 A1 | 9/2012 |

OTHER PUBLICATIONS

Office Action dated Oct. 17, 2017, Japanese Patent Application No. 2016-504645, 9 pages.
EPO as ISA, PCT/EP2014/056007 filed Mar. 26, 2014, "Internationl Search Report and Written Opinion", dated Jul. 10, 2014, 13 pages.
Extended European Search Report dated Jun. 28, 2013, European Patent Application No. 13161033.9, 8 pages.

* cited by examiner

HERMETICALLY SEALED ILLUMINATION DEVICE WITH LUMINESCENT MATERIAL AND MANUFACTURING METHOD THEREFOR

CROSS-REFERENCE TO PRIOR APPLICATIONS

This application is the U.S. National Phase application under 35 U.S.C. § 371 of International Application No. PCT/EP2014/056007, filed on Mar. 26, 2014, which claims the benefit of U.S. Patent Application No. 61/805,207, filed on Mar. 26, 2013 and EP Patent Application No. EP13161033.9, filed on Mar. 26, 2014. These applications are hereby incorporated by reference herein.

FIELD OF THE INVENTION

The present invention relates to illumination devices. More precisely, the present invention relates to a method for manufacturing an illumination device having an enclosed space provided with a luminescent material, and to such an illumination device.

BACKGROUND OF THE INVENTION

Illumination devices are known, wherein a luminescent, or wavelength converting, material, such as a phosphor, is used for converting e.g. wavelength of light. One drawback with some luminescent materials is however their relative sensitivity to e.g. water or oxygen, which may cause a deterioration of the luminescent material.

In for example US 2011/0317397, this issue is addressed by providing a substantially transparent cover member which is hermetically sealed to the housing of the device, thereby enclosing quantum dots inside. The sealing operation can be done at a silicon wafer level, wherein the hermetical seal is formed by anodic bonding of a glass wafer onto a silicon wafer.

There is however still a need for an improved manufacturing method for obtaining an illumination device wherein the luminescent material is protected from exposure to the environment.

SUMMARY OF THE INVENTION

An object of at least some of the embodiments of the present invention is to provide an improved method of manufacturing an illumination device having a luminescent material being protected from exposure to the environment, e.g. from exposure to oxygen and/or water.

Accordingly, a method, a device, and an illumination device having the features of the independent claims are provided. The dependent claims define advantageous embodiments.

According to a first aspect, a method for manufacturing an illumination device is provided. A substrate having a first side is provided, and an at least partially light transmitting cover is sealingly coupled to the substrate such that an enclosed space is defined by at least the first side of the substrate and the cover. A through-hole into the enclosed space is provided, through which through-hole a luminescent material is introduced into the enclosed space. After introduction of the luminescent material, the through-hole is then sealed so as to seal the enclosed space.

According to a second aspect, a device is provided, which comprises a substrate with a first side and an at least partially light transmitting cover which is sealingly coupled to the substrate such that at least the first side of the substrate and the cover define an enclosed space. The device further comprises a through-hole being arranged to permit introduction of a luminescent material into the enclosed space, which becomes sealed upon sealing of the through-hole. It is appreciated that the device according to the second aspect may be regarded as an intermediate product of the manufacturing method according to the first aspect, wherein the through-hole of the present device has not yet been sealed.

According to a third aspect, an illumination device is provided. The illumination device comprises a substrate having a first side, and an at least partially light transmitting cover being sealingly coupled to the substrate such that an enclosed space is defined by at least the first side of the substrate and the cover. The device further comprises a luminescent material included within the enclosed space, and a sealed through-hole into the enclosed space, which enclosed space is sealed by the through-hole being sealed. The through-hole is arranged so as to, prior to being sealed, permit introduction of the luminescent material into the enclosed space.

Several advantages are associated with the present aspects. Firstly, by applying the luminescent material after the cover is sealed to the substrate, the sealing may be provided by e.g. a hot joining technique without risking damaging relatively temperature sensitive luminescent materials. Instead, the luminescent material may be applied at a relatively late stage of the production process of the illumination device such that the risk of detrimentally affecting the luminescent material in subsequent processing steps may be reduced. Further, since the luminescent material is not applied prior to the cover being coupled to the substrate, the handling of the cover may be facilitated during the production steps preceding the coupling of the cover to the substrate. More precisely, a cover having no luminescent material may be less sensitive to environmental conditions, such as exposure to water, oxygen, and heat, and to mechanical damage caused by the handling. Furthermore, by including the luminescent material within the enclosed space, a wider variety of luminescent materials may be utilized that otherwise are not applicable due to their relatively environmental sensitivity. The present aspects may also enable production of illumination devices, which utilize luminescent materials, which illumination devices have a capability to operate in harsh environments, such as e.g. when being submerged in a liquid such as water, and within greenhouses.

In one embodiment, the luminescent material at least partially fills the enclosed space or volume. The luminescent material may for example be injected into the enclosed space. It may then be relatively easy to adjust the light conversion efficiency, i.e. the relative proportion of light converted by the luminescent material, e.g. by varying the volume of the provided luminescent material.

For example, the luminescent material may be provided in a layer provided on at least a portion of an inner surface of the cover. By varying the pattern and/or the area of the portion of the inner surface that is covered by the luminescent material, the proportion of light that is converted e.g. with respect to wavelength may advantageously be controlled. The portions of the inner surface which are not provided with the luminescent material may, e.g., be provided with another light converting layer, or phosphor, or with no layer at all, in order to obtain a light output having a required color composition.

In one embodiment, capillary grooves are formed on the inner surface of the cover prior to introducing the luminescent material into the enclosed space. The width and depth of the capillary grooves are chosen such that the luminescent material, which e.g. may be applied in a liquid phase, is diffused along the capillary grooves by capillary action upon application on the inner surface. This is advantageous in that it may facilitate the application and distribution of the luminescent material, and also allows for an improved control of the applied amount of luminescent material. The applied volume of the liquid may be determined by the length, depth, and/or pitch of the capillary grooves, and the amount of applied luminescent material may be determined by its concentration in the liquid. The capillary grooves may be provided by injection molding, by removing material from the surface of the cover, e.g. by wet etching, dry etching, scratching, or grinding, or by depositing material defining the capillary grooves, e.g. by sputtering, evaporation, plating, photolithographic patterning, or laminating.

Examples of luminescent materials sensitive to hydrolysis (i.e. a reaction with water) may include $CaS_{1-x}Se_x$:Eu and MgS. Other examples of luminescent materials may e.g. include quantum confinement structures, which may be relatively sensitive to environments comprising water and/or oxygen.

The term "quantum confinement structures" should, in the context of the present application, be understood as e.g. quantum wells, quantum dots, quantum rods, or nano-wires. A quantum well is a potential well with only discrete energy values and may be formed in semiconductors by having a material, like gallium arsenide or indium gallium nitride, sandwiched between two layers of a material with a wider band gap, like aluminum arsenide or gallium nitride. Quantum dots (or rods, or nano-wires) are small crystals of semiconducting material generally having a size, e.g. width, radius or diameter, of only a few nanometers. When excited by incident light, a quantum dot emits light of a color determined by the size and material of the crystal. Light of a particular color can therefore be produced by adapting the size and/or material of the quantum dots. Most known quantum dots with emission in the visible range of the electromagnetic spectrum are based on cadmium selenide (CdSe) with a shell (or shells) such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots generally have a very narrow emission band and can thus provide saturated colors. Furthermore the color of emitted light can be tuned by adapting the size of the quantum dots.

Any type of quantum confinement structures known in the art may be used in embodiments of the present invention, provided that the quantum confinement structures have the appropriate wavelength conversion characteristics. However, it may be preferred for reasons of environmental safety and concern to use cadmium-free quantum confinement structures or at least quantum confinement structures having a relatively low cadmium content.

The substrate referred to above may be a printed circuit board (PCB), such as e.g. a ceramic PCB comprising alumina, which may provide mechanical support and electrical connections to light sources. Alternatively or in addition, the substrate may comprise a leadframe. The substrate may comprise a ceramic or polymeric material, and may have a relatively high thermal conductivity to enable a good heat performance, or cooling, of light sources provided on the substrate. Further, the substrate may comprise a light reflecting region arranged to reflect at least a part of the light generated by the light sources, and/or phosphor layer (or volume) arranged to convert at least part of the generated light to other colors, which advantageously may increase the light conversion efficiency.

In the context of the present application, the term "light source" is used to define substantially any device or element that is capable of emitting radiation in any region or combination of regions of the electromagnetic spectrum, for example the visible region, the infrared region, and/or the ultraviolet region, when activated e.g. by applying a voltage across it or forcing a current through it. Therefore a light source can have monochromatic, quasi-monochromatic, polychromatic or broadband spectral emission characteristics. Examples of light sources include semiconductor, organic, or polymer/polymeric light-emitting diodes (LEDs), blue LEDs, optically pumped phosphor coated LEDs, optically pumped nano-crystal LEDs or any other similar devices as known to a person skilled in the art. The light sources may be provided on the substrate such that an electrical connection is provided between the substrate and the light sources. The light sources may be arranged on or coupled to the substrate so as to be able to emit light generally within the enclosed space and towards the at least partially light transmitting cover.

The at least partially light transmitting cover may comprise a transparent and/or translucent material being gastight (impervious to gas), or at least having a relatively low gas transmission therethrough. Examples of such materials include alumina, yttrium aluminum garnets (YAG), lutetium aluminum garnets (LuAG), spinels, aluminum oxynitrides (AlONs), glass, and other suitable materials as known to a person skilled in the art. The at least partially light transmitting cover may be injection molded, which also may be used for providing the capillary grooves referred to above. Forming the capillary grooves and the at least partially light transmitting cover by injection molding may reduce the number of required processing steps and thereby enable a facilitated manufacturing. Ceramics is an example of materials that may be injection molded.

The cover may be coupled to the substrate by various joining methods wherein, e.g., metal is joined to metal or ceramic, or wherein ceramic is joined to ceramic, in order to obtain a hermetic, i.e. a relatively gastight, seal. This may be achieved by applying an additive at the joint or junction, where the additive for example comprises metals (e.g. solder), ceramics, or glass (e.g. frit). Examples of joining methods include soldering, active solder, frit joining, laser assisted frit joining, laser welding, resistance welding, friction stir welding, ultrasonic welding, heat shrinking, pressure clamping, induction soldering, screwing, and gluing.

The through-hole referred to above may for example extend between the first side of the substrate to a second side of the substrate, or between the inner surface of the cover to an outer surface of the same. At least one through-hole into the enclosed space may be provided. It will be appreciated that the through-hole may be straight or curved and arranged so as to have a diameter which allows the luminescent material to be inserted in or introduced into the enclosed space via the through-hole. The through-hole may be combined with a via for electrically connecting the light source. After introduction of the luminescent material into the enclosed space, the through-hole may be sealed by for example soldering or fitting, such that the through-hole is filled, or partly filled, with the sealing material. The seal may also be provided as e.g. a cap arranged at an end portion of the through-hole.

In one embodiment, there is provided a thermally conductive element, e.g. a so called cooling ring, which is sealingly coupled to the at least partially light transmitting cover and the substrate. The thermally conductive element may, e.g., comprise metal or ceramic, and advantageously allow heat generated by any light source provided on the substrate, as well as heat generated by the luminescent material, to be dissipated through the thermally conductive element to the substrate and/or a heat sink. Thereby cooling of the luminescent or light conversion material, e.g. the quantum confinement structures and/or the phosphor, may be achieved. Hence, providing of the at least partially light transmitting cover sealingly coupled to the substrate may comprise sealingly coupling the at least partially light transmitting cover to a thermally conductive element, which is sealingly coupled to the substrate, wherein the enclosed space is further defined by the thermally conductive element. Further, the thermally conductive element may be integrally formed with the cover or the substrate such that the required number of components, or parts, is reduced and hence the assemblage facilitated. Hence, provision of the at least partially light transmitting cover sealingly coupled to the substrate may comprise sealingly coupling a thermally conductive element, which is integrally formed with the at least partially light transmitting cover, to the substrate, wherein the enclosed space is further defined by the thermally conductive element.

Alternatively, providing the least partially light transmitting cover sealingly coupled to the substrate may comprise sealingly coupling a thermally conductive element, which is integrally formed with the substrate, to the at least partially light transmitting cover, wherein the enclosed space is further defined by the thermally conductive element.

Furthermore, the thermally conductive element may be provided with a through-hole for introduction of luminescent material into the enclosed space. After the introduction of the luminescent material into the enclosed space, the through-hole may be sealed such that the enclosed space becomes (hermetically) sealed.

In one embodiment, there is provided an at least partially light reflecting structure, comprising e.g. alumina, which at least partially light reflecting structure at least partially covers the at least partially light transmitting cover. The at least partially light reflecting structure may for example have the form of a ring. The at least partially light reflecting structure may be sintered, injection molded, and/or shrink-fitted to the cover such that it covers the side portions of the cover. Thereby radial light leakage, i.e. light emitted in directions substantially parallel with the inner surface of the cover, may advantageously be reduced. Instead of radially leaking, the light may be reflected back into the enclosed space.

In one embodiment, there is further provided an at least partially light transmitting envelope which is sealingly coupled to the substrate to at least partially enclose the at least partially light transmitting cover, so as to further ensure a hermetical sealing of a relatively environmentally sensitive luminescent material. Thereby the sealing between the at least partially light transmitting cover and the substrate may be less gastight as compared with the previous embodiments. The provision of the at least partially light transmitting envelope may be performed prior to the application or introduction of the luminescent material via the through-hole, or after the luminescent material have been applied or introduced.

An at least partially light reflecting layer may be provided on at least a portion of the first side of the substrate. Such an at least partially light reflecting layer may reflect at least a portion of the light generated by light sources provided e.g. on the substrate.

In one embodiment, one or several phosphor layers (e.g. being inorganic and/or comprising quantum confinement structures) may be provided on the at least partially light transmitting cover, e.g. on an inner and/or outer surface of the at least partially light transmitting cover. This enables different types of light conversion means to be used in different combinations in order to obtain emission of light in various colors. Phosphor layers being less environmentally sensitive to e.g. water and/or oxygen may e.g. be provided on an outer surface of the cover.

In case the luminescent material, e.g. comprising a plurality of quantum confinement structures, is provided in a layer provided on at least a portion of an inner surface of the cover, at least one of the layer comprising the luminescent material and the phosphor layer may be arranged such that the illumination device is capable of emitting light of different color via different portions, or regions, of the cover. For example, the phosphor layer may be patterned, e.g. with a chess board pattern, or applied in several layers.

Further objectives, features and advantages of the present invention will become apparent when studying the following detailed disclosure, the drawings and the appended claims. Those skilled in the art realize that different features of the present invention, even if recited in different claims, can be combined in embodiments other than those described in the following.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, in which.

The sizes of layers and regions as illustrated in the figures are schematic and exaggerated for illustrative purposes and, thus, are provided to illustrate the general structures of embodiments of the present invention. Like reference numerals refer to like elements throughout.

DETAILED DESCRIPTION

The present invention will now be described hereinafter with reference to the accompanying drawings, in which currently preferred embodiments of the invention are shown. This invention may, however, be embodied in many different forms and should not be construed as limited to the embodiments set forth herein; rather, these embodiments are provided for conveying the scope of the invention to the skilled person. The steps of any method disclosed herein do not have to be performed in the exact order as disclosed, unless explicitly stated so.

Figure 1:
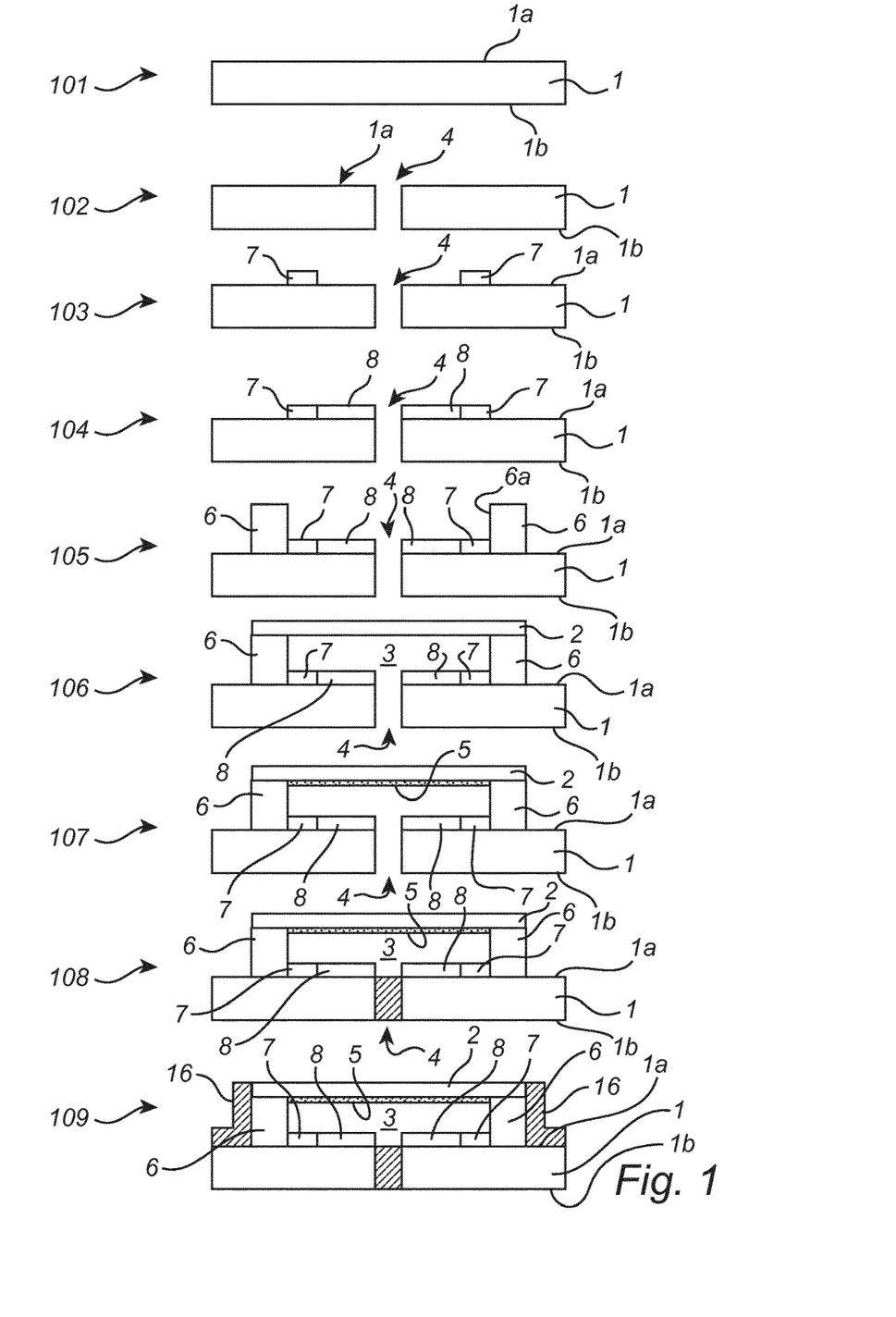
FIG. 1 illustrates a general outline of a method for manufacturing an illumination device according to an embodiment of the present invention.

With reference to FIG. 1, there is shown a general outline of a method of manufacturing an illumination device in accordance with an embodiment of the present invention. FIG. 1 shows cross-sectional side views of (parts of) the illumination device.

A substrate 1, such as a ceramic PCB, is provided, at 101, wherein a through-hole 4 is provided or formed, at 102, such that it extends from a first side 1a to a second side 1b of the substrate 1. The substrate 1 may also be provided, at 103, with light sources 7 mounted on the first side 1a of the substrate 1. The light sources 7 may e.g. have underside electrical contacts, facing the first side 1a of the substrate 1, which may be soldered to electrically conducting tracks (not shown) on the substrate 1. Alternatively, or additionally, the light sources 7 may have topside electrical contacts, wherein the light sources 7 may be electrically connected to each other by e.g. wire-bond connections, and edge wire-bonded to the electrically conducting tracks on the substrate 1. Furthermore, the light sources 7 may be glued to the first side 1a of the substrate 1. An at least partially light reflecting layer 8 may be arranged, at 104, to reflect at least a portion of the light generated by the light sources 7. A thermally conductive element 6, e.g. a cooling ring 6, made of e.g. aluminum is sealingly coupled, at 105, to the first side 1a of the substrate 1 by e.g. soldering or welding.

In a further step 106, an at least partially light transmitting cover 2, e.g. formed as a circular disc 2, is arranged on the thermally conductive element 6, e.g. a cooling ring, so as to sealingly (i.e. in a sealing manner) couple the cover 2 to the substrate 1. Thereby an enclosed space or volume 3 is defined by the first side 1a of the substrate 1, an inner side 6a of the thermally conductive element 6, and an inner side of the cover 2. The sealing between the cover 2 and the thermally conductive element 6 may be provided by e.g. welding, bonding, or soldering.

The enclosed space 3 may be accessed from the surroundings of the illumination device via the through-hole 4, which thereby allows a luminescent material, e.g. comprising a plurality of quantum confinement structures such as quantum dots (QDs), to be introduced, at 107, into the enclosed space 3 by means of e.g. a syringe (not shown). The example of where the luminescent material includes a plurality of quantum structures, such as QDs, is mainly referred to in the following description. However, it is to be understood that this is not to be interpreted as limiting the present invention in any way. In alternative or in addition, the luminescent material may include, for example, other type(s) of luminescent materials sensitive to hydrolysis, such as $CaS_{1-x}Se_x$:Eu and MgS, a phosphor, or any other environmentally sensitive luminescent material. Principles of the embodiments of the present invention described in the following are substantially the same or the same irrespective of the type of luminescent material that is introduced and included within the enclosed space 3.

The luminescent material, e.g. including QDs, may be carried by a binder or liquid material, or e.g. a silicone or acrylic matrix, which may be injected, at 107, in the enclosed space 3 via the through-hole 4 so as to form a layer 5 on at least a portion of the inner surface of the cover 2. The layer 5 or matrix may then be cured so as to fixate the QDs to the cover 2.

After the introduction, at 107, of the luminescent material, e.g. including a plurality of quantum confinement structures, into the enclosed space 3, an intermediate device, in which the through-hole 4 is not yet sealed, is obtained. Hence, a device is obtained, which comprises a substrate 1 having a first side 1a, and an at least partially light transmitting cover 2 being sealingly coupled to the substrate 1 such that an enclosed space 3 is defined by at least the first side 1a of the substrate 1 and the cover 2. The device further comprises a through-hole 4 being arranged so as to permit introduction of a luminescent material, e.g. including a plurality of quantum confinement structures, into the enclosed space 3, wherein the enclosed space 3 becomes sealed when the through-hole 4 is sealed.

Prior to sealing the through-hole 4, any non-filled regions of the enclosed space 3 may be filled up with e.g. an inert gas, such as nitrogen or a noble gas, or by a filling material such as e.g. silicone. The non-filled regions may also be provided with a negative pressure, or vacuum. Additionally, or alternatively, the enclosed volume 3 may comprise a getter material, such as e.g. calcium, which may react with any water and/or oxygen leaking into the enclosed space 3. Thereby the luminescent material (e.g. including QDs) may be further protected from being deteriorated and thus improving the lifetime of the illumination device.

By sealing 108 the through-hole 4, e.g. in a hermetically, or gastight manner, the luminescent material, e.g. including quantum confinement structures, is protected from exposure to the environment. By sealing 108 the through-hole 4 an illumination device according to an embodiment of the present invention is obtained. Hence, an illumination device is obtained, which comprises a substrate 1 having a first side 1a, and an at least partially light transmitting cover 2 which is sealingly coupled to the substrate 1 such that an enclosed space 3 is defined by at least the first side 1a of the substrate 1 and the cover 2. Furthermore, a luminescent material, e.g. including a plurality of quantum confinement structures, is included within the enclosed space 3. The illumination device also comprises a sealed through-hole 4 into the enclosed space 3, wherein the enclosed space 3 is sealed by the through hole 4 being sealed, and wherein the through-hole 4 is arranged so as to, prior to being sealed, permit introduction of the luminescent material, e.g. including quantum confinement structures, into the enclosed space 3. The through-hole 4 may be sealed by using any of the sealing methods referred to above, e.g., soldering, welding, or fitting. The sealing may for example fill the entire through-hole 4, or some of the through-hole 4, or be provided as a cap at an end of the through-hole 4.

Additionally, the cover 2 and the thermally conductive element 6 may be at least partially covered by an at least partially light reflecting structure 16 e.g. in the form of an at least partially light reflecting ring 16 which is provided circumferentially around the thermally conductive element 6 and the end (peripheral) portion of the cover 2 so as to prevent radial light leakage from the enclosed space 3, the sides of the cover 2, and/or the thermally conductive element 6. The light reflecting ring 16 may e.g. be an alumina ring 16, which is sintered or shrink fitted around the cover 2, or applied by injection molding.

It will be appreciated that the step of providing, at 102, the through-hole 4 as referred to above may be performed prior to the enclosed space 3 being defined or formed, at 106, or after the same. It is also noted that the steps of introducing 107 the luminescent material, e.g. including a plurality of quantum confinement structures, into the enclosed space 3 and sealing, at 108, the through-hole 4 may be performed prior to or after the light reflecting ring 16 is provided at 109.

Figure 2:
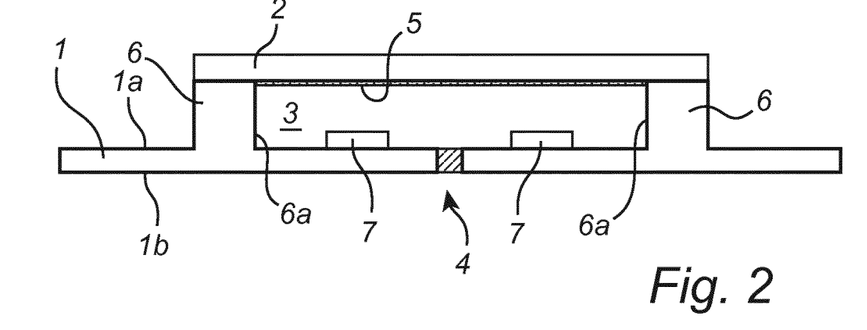
FIGS. 2-7 are cross-sectional side views of illumination devices manufactured in accordance with embodiments of the present invention, and FIG. 8 schematically depicts an at least partially light transmitting cover manufactured in accordance with an embodiment of the present invention.

FIG. 2 illustrates a cross-sectional side view of an illumination device manufactured in accordance with an embodiment of the present invention. The illumination device comprises a substrate 1 and a thermally conductive element 6, e.g. a cooling ring, which is integrally formed with the substrate 1. An at least partially light transmitting cover 2 is sealingly coupled to the substrate 1 via the thermally conductive element 6 such that an enclosed space 3 is defined by a first surface 1a of the substrate 1, an inner surface 6a of the thermally conductive element 6, and an inner surface of the cover 2. FIG. 2 also illustrates a hermetically sealed through-hole 4, extending from the first side 1a to a second side 1b of the substrate 1, through which through-hole 4 luminescent material, including quantum confinement structures, have been introduced into the enclosed space 3 and formed into a phosphor layer 5 on the inner surface of the cover 2. In addition or alternatively, a type of luminescent material other than quantum confinement structures may be introduced into the enclosed space 3. The phosphor layer 5 hence includes the quantum confinement structures. The first side 1a of the substrate 1 is further provided with two light sources 7 which are electrically and mechanically coupled to the substrate 1. The number of light sources 7 in FIG. 2 is merely according to an example. The illumination device may include any appropriate number of light sources. During operation of the illumination device, light generated by the light sources 7 may be converted by means of the phosphor layer 5 into a desired wavelength and emitted from the illumination device via the at least partially light transmitting cover 2. It will be realized that several different phosphor layers, or mixtures of different phosphors within the same layer, may be used for providing emitted light having a desired mixture of wavelengths, and that not all of the phosphors are environmentally sensitive.

Figure 3:
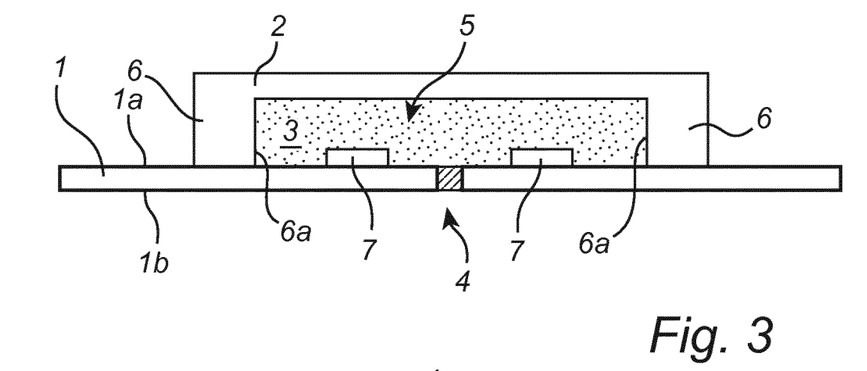

In FIG. 3, there is depicted a cross sectional side view of an illumination device similar to the illumination device as described with reference to FIG. 2, wherein a thermally conductive element 6, e.g. a cooling ring, according to the embodiment depicted in FIG. 3 is integrally formed with the at least partially light transmitting cover 2. The thermally conductive element 6 and the at least partially light transmitting cover 2 may e.g. comprise optically transparent or translucent alumina, which may be injection molded. A reflective layer 16 (not shown in FIG. 3) may be circumferentially provided around the thermally conductive element 6 so as to prevent radial leakage from the enclosed space 3. The reflective layer 16 may e.g. comprise a reflective grade of alumina. As suggested by FIG. 3, the enclosed volume 3 may optionally be filled, or at least partially filled, with a luminescent material, such as e.g. a silicone matrix comprising QDs. At least partially filling the enclosed volume 3 with luminescent material is combinable with any one of the embodiments described herein.

Figure 4:
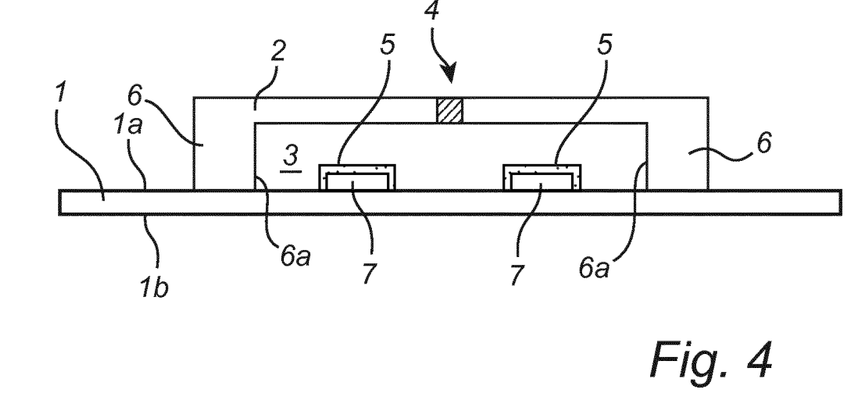

FIG. 4 illustrates a cross sectional side view of an illumination device similar to the illumination device as described with reference to FIG. 3, wherein the through-hole 4 is provided in the at least partially light transmitting cover 2. According to the embodiment depicted in FIG. 4, the luminescent material 5, being introduced into the enclosed space 3 via the through-hole 4, may be provided in a layer on the light sources 7. Providing the luminescent material 5 in a layer on the light sources 7 is combinable with any one of the embodiments described herein. After the introduction of the luminescent material 5, the through-hole 4 may be sealed, or hermetically closed, with an adhesive, such an epoxy, or a solder material, a glass frit, or an alumina plug which, for a cover 2 comprising an alumina material, e.g. may be laser fused to the cover 2.

Figure 5:
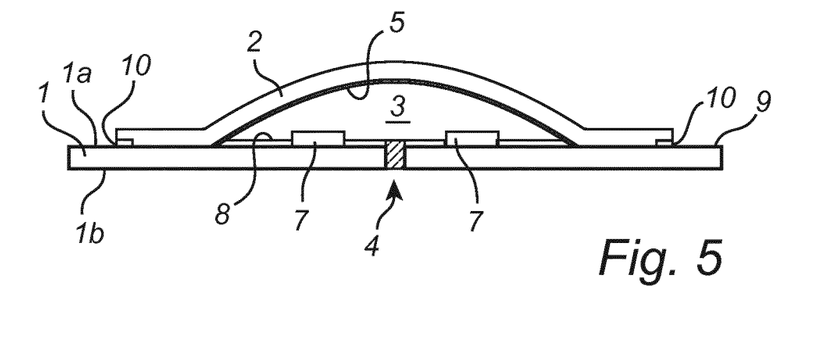

FIG. 5 depicts an illumination device in accordance with another embodiment of the present invention, which is similar to the illumination devices as described with reference to FIGS. 3 and 4. According to the embodiment depicted in FIG. 5, the substrate 1 is provided with conductive pathways 9 for providing electrical connections to the light sources 7 arranged on the first side 1a of the substrate 1. There is also provided, on a at least a portion of the first side 1a of the substrate 1, an at least partially light reflecting layer 8 arranged to reflect a portion of the light generated by the light sources 7. According to this embodiment, the at least partially light transmitting cover 2 has a concave inner surface and a convex outer surface and is coupled directly to the first side 1a of the substrate 1 by means of a hermetical seal 10. The inner surface of the cover 2 is provided with a luminescent material, e.g. a phosphor layer 5 comprising QDs, which are introduced into the enclosed space 3 via the through-hole 4 which is then sealed so as to seal the enclosed space 3, as illustrated in FIG. 5.

Figure 6:
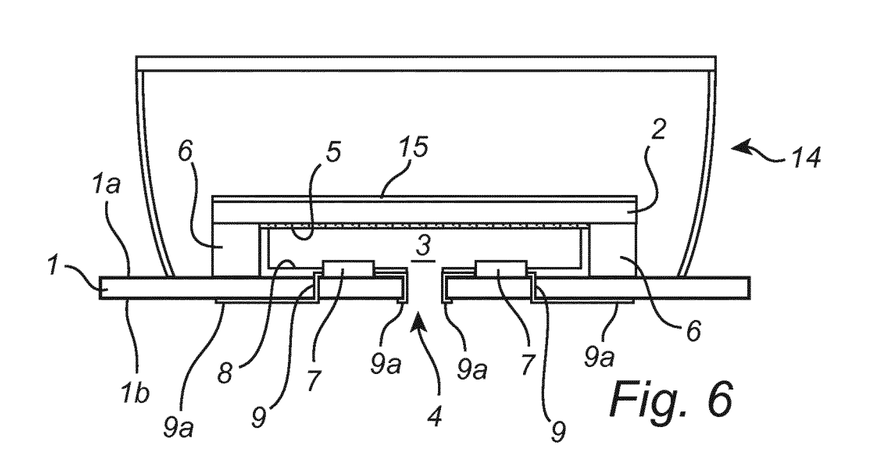

FIG. 6 depicts an illumination device comprising a substrate 1 having a first side 1a and a second side 1b, wherein the first side 1a is provided with light sources 7 and an at least partially light reflecting layer 8. An at least partially light transmitting cover 2 is sealingly coupled to the first side 1a of the substrate 1 via a thermally conductive element 6, e.g. a cooling ring, having an inner side provided with an at least partially light reflecting layer 8, for enabling heat dissipation from the illumination device. A luminescent material, including e.g. quantum confinement structures, is provided in a layer 5 on an inner side of the cover 2, so as to convert light which is passing therethrough e.g. with respect to wavelength, which light subsequently can be emitted by the illumination device. The substrate 1 is provided with conductive pathways 9 for providing electrical connections to the light sources 7 arranged on the first side 1a of the substrate 1. The cover 2 may be provided with another phosphor layer 15, or several phosphor layers 15, which, e.g., may be provided on an outer surface of the cover 2, as illustrated in FIG. 6.

In accordance with the embodiment depicted in FIG. 6, an at least partially light transmitting envelope 14 may be sealingly coupled to the first surface 1a of the substrate 1 so as to enclose the thermally conductive element 6 and the at least partially light transmitting cover 2. Furthermore, the envelope 14 may provide a reflector forming emitted light into collimated beam, such as needed for providing e.g. a spot lamp. The top cover of the envelope 14, through which the collimated beam exits, may e.g. comprise an at least partially light transmitting protective cover of glass. The sides of the envelope 14, which couple the top cover to the substrate 1, may e.g. comprise a glass provided with an at least partially light reflecting metal layer. The envelope 14 may, e.g., be sealingly coupled to the first side 1a of the substrate 1 by a frit material.

It will be appreciated that the envelope 14, according to an embodiment, may constitute an at least partially light transmitting cover 2 such as described with reference to FIGS. 1 to 5. In such case, wherein the envelope 14 comprises a through-hole 4 which upon sealing seals the enclosed space 3, the element 2 shown in FIG. 6 may be excluded from the illumination device in FIG. 6, or may not necessarily be sealingly coupled to the substrate 1. In such case, the phosphor layer 15 may be omitted and the layer 5 with luminescent material may be provided e.g. on an inner side of the envelope 14.

FIG. 6 also illustrates a through-hole 4, extending from the first side 1a to the second side 1b of the substrate 1, through which through-hole 4 luminescent material, comprising e.g. quantum confinement structures, is introduced into an enclosed space 3, defined by an inner side of the cover 2, the thermally conductive element 6, and the first side 1a of the substrate 1. The enclosed space 3 is sealed from the surroundings of the illumination device by sealing of the through-hole 4. As indicated in FIG. 6, the through-hole 4 may be combined with conductive pathways such as electrical vias 9 for supplying the light sources 7 with electrical energy. This may e.g. be achieved by plating electrical wirings to the walls of the through-hole 4, wherein the electrical wiring is electrically connected to the light sources 7 and contact pads 9*a* on the second side 1*b* of the substrate 1.

Figure 7:
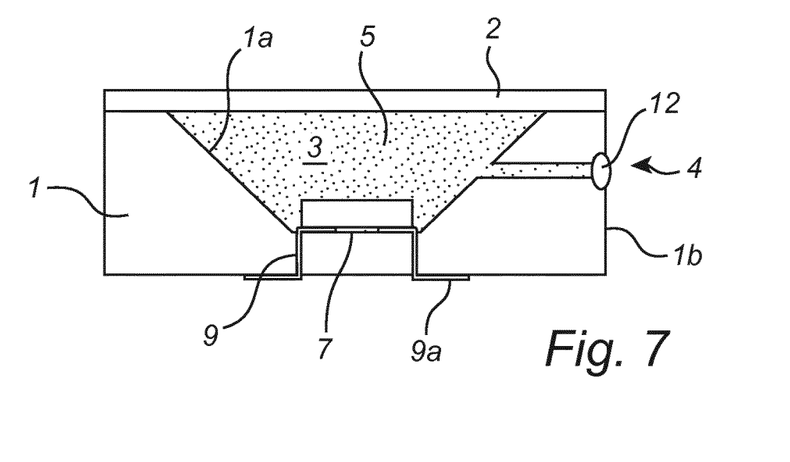

With reference to FIG. 7, there is schematically shown a cross-sectional side view of an illumination device manufactured in accordance with another embodiment of the present invention. The illumination device comprises a substrate 1 having a first side 1*a* and a second side 1*b*.

The substrate 1, comprising e.g. a ceramic PCB 1, forms a cavity, or 'cup', having tapered inner walls arranged on a first side 1*a* of the substrate 1. Other shapes of the cavity than the one illustrated in FIG. 7 are however possible. The first side 1*a* of the substrate 1 is provided with a light source 7 which is electrically connected by electrical wirings 9. An at least partially light transmitting cover 2 is sealingly coupled to the substrate 1, by e.g. active solder, such that the cavity together with the cover 2 forms an enclosed space or volume 3. A through-hole 4, which according to the embodiment depicted in FIG. 7 extends substantially parallel with the cover 2 from the first side 1*a* to a second side 1*b* of the substrate 1, allows the enclosed space 3 to be filled, or at least partially filled, with a luminescent material 5 e.g. including quantum confinement structures, e.g. a matrix material comprising e.g. QDs. In order to provide a hermetically sealed enclosed space 3, the through-hole 4 can be provided with a relatively gastight seal 12 after the introduction of the quantum confinement structures, e.g. QDs, into the enclosed space 3.

Generally, the term "through-hole" should in the context of the present application be understood as a 'physical' hole arranged e.g. through the at least partially light transmitting cover 2, the substrate 1, or the thermally conductive element 6. The through-hole 4 may e.g. have a round shape, a square shape, or a rectangular shape. Furthermore, the through-hole may be provided with an extension extending into the enclosed space 3 and/or outside of the illumination device in order to facilitate the introduction of the luminescent material into the enclosed space 3. The shape of the extension may e.g. conform to the shape of a tube or a funnel. Furthermore, a plurality of through-holes 4 may be provided. It will also be appreciated that the through-hole(s) 4 may be elongated or formed into a spiral shape in order to facilitate an even distribution of the luminescent material being introduced into the enclosed space 3.

Figure 8:
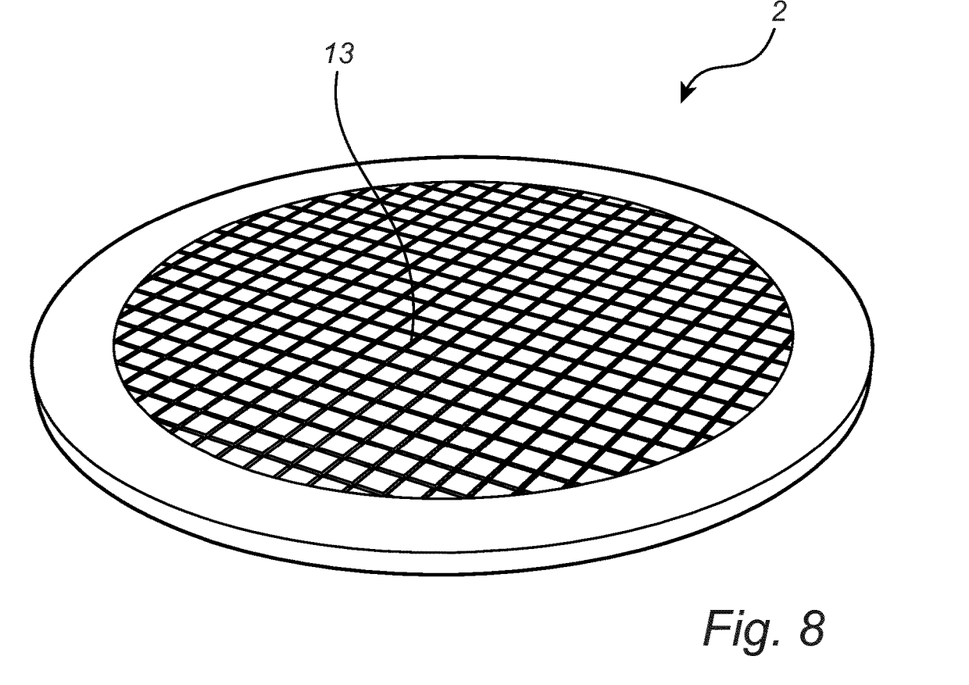

Finally, FIG. 8 depicts an at least partially light transmitting cover 2 in accordance with an embodiment of the present invention. The cover 2, which may be formed of an injection molded ceramic, has a shape of a substantially circular disc 2 and is provided with capillary grooves 13 on an inner surface of the cover 2. The capillary grooves 13 may be etched or co-injection molded into the inner surface of the cover 2 and have a respective width and depth chosen such that the liquid carrier, or matrix material, for luminescent material, such as QDs, may be diffused along the capillary grooves 13 by means of capillary action upon being applied on the inner surface of the cover 2. Thereby it may be enabled to achieve an even distribution of the luminescent material, e.g. including quantum confinement structures such as QDs, along the grooves 13. As illustrated in FIG. 8, the capillary grooves 13 may be arranged in e.g. a rectangular network, a radial pattern, or a spiral, covering the inner surface of the cover 2. The cover 2 depicted in FIG. 8 may be combined with or implemented in any one of the embodiments of the present invention described herein.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A method for manufacturing an illumination device, the method comprising:
   providing a substrate having a first side provided with a light source;
   providing an at least partially light transmitting cover sealingly coupled to the substrate such that a chamber is defined by at least the first side of the substrate and the cover;
   providing a through-hole into the chamber;
   introducing a luminescent material into the chamber via the through-hole such that a layer of luminescent material is provided on at least a portion of an inner surface of the cover; and
   after the introduction of the luminescent material, sealing the through-hole with a sealing material that is different from the luminescent material, the sealing material being disposed in the through-hole and configured to protect the luminescent material from an environment of the illumination device.

2. The method according to claim 1, further comprising forming capillary grooves on the inner surface of the cover prior to introducing the luminescent material into the chamber.

3. The method according to claim 1, wherein providing the at least partially light transmitting cover sealingly coupled to the substrate comprises sealingly coupling the at least partially light transmitting cover to a thermally conductive element which is sealingly coupled to the substrate, wherein the chamber is further defined by the thermally conductive element.

4. The method according to claim 1, wherein providing an at least partially light transmitting cover sealingly coupled to the substrate comprises sealingly coupling a thermally conductive element integrally formed with the at least partially light transmitting cover to the substrate, wherein the chamber is further defined by the thermally conductive element.

5. The method according to claim 1, wherein providing an at least partially light transmitting cover sealingly coupled to the substrate comprises sealingly coupling a thermally conductive element integrally formed with the substrate to the at least partially light transmitting cover, wherein the chamber is further defined by the thermally conductive element.

6. The method according to claim 1, further comprising providing an at least partially light transmitting envelope sealingly coupled to the substrate such that the at least partially light transmitting cover is at least partially enclosed by the at least partially light transmitting envelope.

7. The method according to claim 1, wherein the substrate further has a second side, wherein the through-hole is provided in the substrate so as to extend from the first side of the substrate to the second side of the substrate.

8. The method according to claim 3, wherein the through-hole is provided in the thermally conductive element.

9. A device comprising:
   a substrate having a first side provided with a light source;
   an at least partially light transmitting cover sealingly coupled to the substrate such that a chamber is defined by at least the first side of the substrate and the cover;
   a luminescent material in the chamber;
   a through-hole into the chamber, the through-hole being arranged to permit introduction of the luminescent material into the chamber, before the through-hole is sealed; and
   a sealing material that is different from the luminescent material, the sealing material being disposed in the though-hole to seal the through-hole and protect the luminescent material from an environment of the device.

10. The device according to claim 9, wherein the luminescent material is provided in a layer on at least a portion of an inner surface of the at least partially light transmitting cover.

11. The illumination device according to claim 10, wherein a phosphor layer is provided on the at least partially light transmitting cover.

12. The illumination device according to claim 10, wherein at least one of the layers comprising the luminescent material and the phosphor layer is arranged such that the illumination device emits light of different colors via different regions of the at least partially light transmitting cover.

13. The illumination device according to claim 11, wherein the phosphor layer is provided on an outer surface of the at least partially light transmitting cover.

14. The method according to claim 1, further comprising after introducing a luminescent material into the chamber and before sealing the through-hole, filling the chamber via the through-hole with a filling material that is different from the luminescent material.

15. The method according to claim 14, wherein the filling material is selected from the group consisting of inert gas, nitrogen, a noble gas, silicone, a getter material, and calcium.

16. The device of claim 9 further comprising a filling material that is different from the luminescent material disposed between the luminescent material and the through-hole.

17. The device of claim 16, wherein the filling material is selected from the group consisting of inert gas, nitrogen, a noble gas, silicone, a getter material, and calcium.

18. The device of claim 9 further comprising a vacuum disposed in the chamber between the luminescent material and the through-hole.

19. The method according to claim 1, wherein the luminescent material includes structures that are sensitive to environmental conditions, and sealing the through-hole protects the luminescent material from exposure to the environmental conditions.

20. The method according to claim 19, wherein the structures comprise quantum confinement structures.

21. The method according to claim 2, wherein introducing the luminescent material comprises applying the luminescent material in a liquid phase such that the luminescent material in the liquid phase diffuses along the capillary grooves on the inner surface of the at least partially light transmitting cover.

22. The method according to claim 1, wherein the luminescent material is selected from a group consisting of $CaS_{1-x}Se_x$:Eu, MgS, and quantum confinement structures that are vulnerable to damage caused by environmental conditions.

23. The method according to claim 1, further comprising providing a phosphor layer on an outer surface of the cover, the phosphor layer being less sensitive to the environment than is the luminescent material on the inner surface of the cover.

24. The device according to claim 9, wherein the luminescent material includes structures that are sensitive to environmental conditions, and the sealing material in the through-hole protects the luminescent material from exposure to the environmental conditions.

* * * * *